United States Patent
Lee

(10) Patent No.: US 7,989,820 B2
(45) Date of Patent: Aug. 2, 2011

(54) SEMICONDUCTOR LIGHT EMITTING DEVICE AND METHOD OF FABRICATING THE SAME

(75) Inventor: Sang Youl Lee, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/516,956

(22) PCT Filed: Jun. 18, 2008

(86) PCT No.: PCT/KR2008/003437
§ 371 (c)(1),
(2), (4) Date: May 29, 2009

(87) PCT Pub. No.: WO2009/002040
PCT Pub. Date: Dec. 31, 2008

(65) Prior Publication Data
US 2010/0065872 A1   Mar. 18, 2010

(30) Foreign Application Priority Data
Jun. 22, 2007  (KR) .................. 10-2007-0061429

(51) Int. Cl.
*H01L 27/15* (2006.01)

(52) U.S. Cl. ........ 257/79; 257/14; 257/94; 257/E33.001

(58) Field of Classification Search .............. 257/79, 257/81, 90, 103, 94; 438/22
See application file for complete search history.

(56) References Cited

U.S. PATENT DOCUMENTS

| | | | |
|---|---|---|---|
| 6,744,071 B2 | 6/2004 | Sano et al. | |
| 7,659,553 B2 * | 2/2010 | Kato et al. | 257/98 |
| 2005/0101064 A1 * | 5/2005 | Yamazaki et al. | 438/149 |
| 2005/0121688 A1 * | 6/2005 | Nagai et al. | 257/99 |

FOREIGN PATENT DOCUMENTS

| | | |
|---|---|---|
| JP | 11-4042 A | 1/1999 |
| JP | 2000-114666 A | 4/2000 |

* cited by examiner

*Primary Examiner* — Ken A Parker
*Assistant Examiner* — Jose R Diaz
(74) *Attorney, Agent, or Firm* — Birch, Stewart, Kolasch & Birch, LLP

(57) ABSTRACT

Provided are a semiconductor light emitting device and a method of fabricating the same. The semiconductor light emitting device comprises: a light emitting structure comprising a first conductive type semiconductor layer, an active layer under the first conductive type semiconductor layer, and a second conductive type semiconductor layer under the active layer; a reflective electrode layer under the light emitting structure, and an outer protection layer at an outer circumference of the reflective electrode layer.

11 Claims, 2 Drawing Sheets

[Fig. 1]
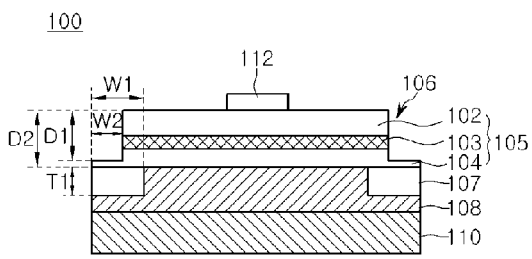
[Fig. 2]
[Fig. 3]
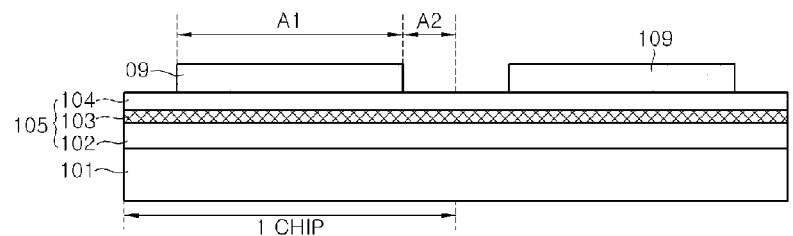
[Fig. 4]
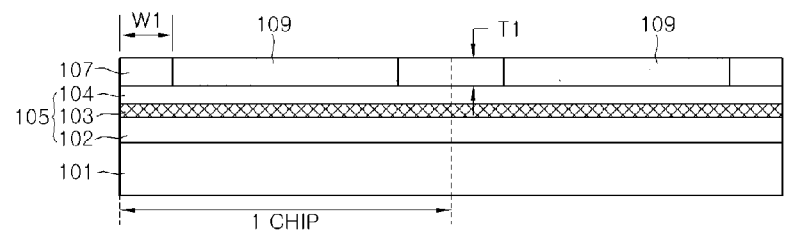
[Fig. 5]
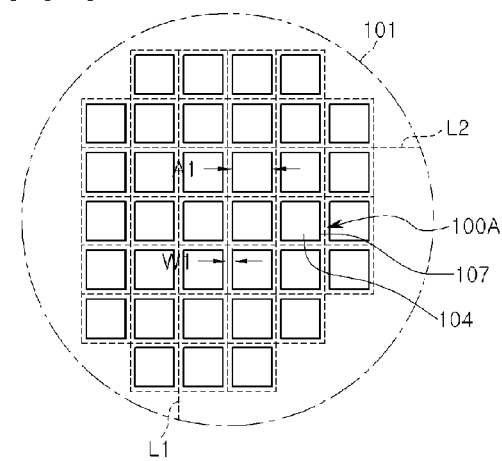
[Fig. 6]
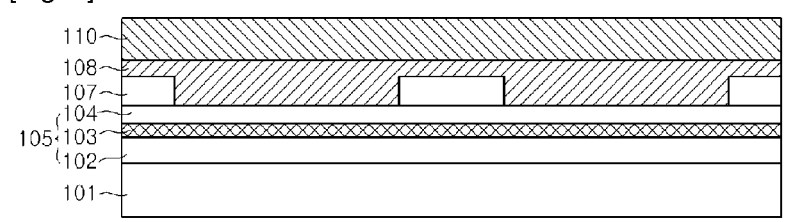

[Fig. 7]
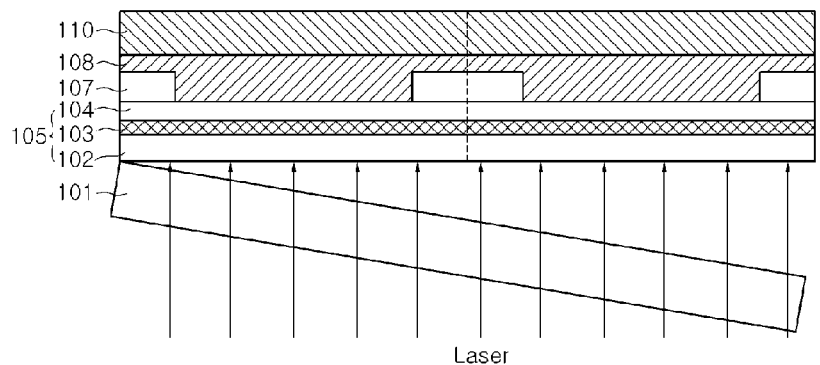
[Fig. 8]
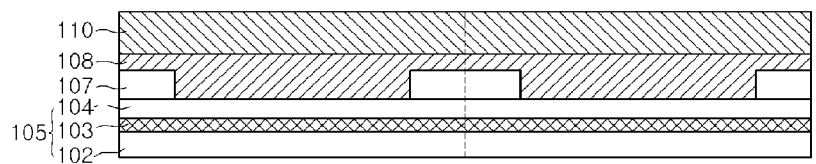
[Fig. 9]
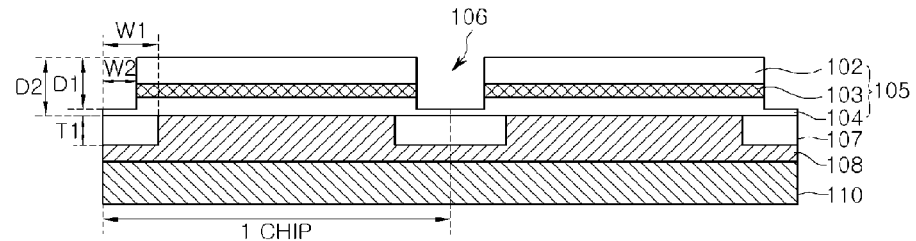
[Fig. 10]
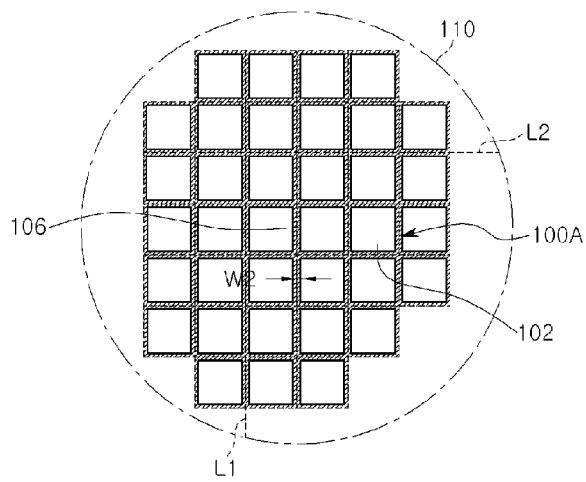
[Fig. 11]
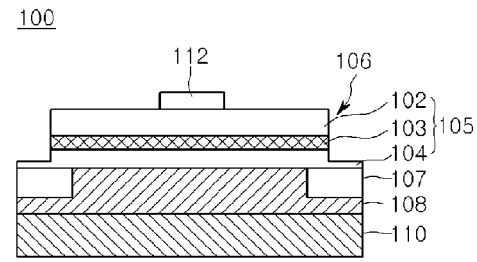

SEMICONDUCTOR LIGHT EMITTING DEVICE AND METHOD OF FABRICATING THE SAME

TECHNICAL FIELD

The present disclosure relates a semiconductor light emitting device and a method of fabricating the same.

BACKGROUND ART

A III-V group nitride semiconductor has been variously used for an optical device such as blue/green LEDs (light emitting diodes), a high speed switching device such as a MOSFET (metal semiconductor field effect transistor) and a HEMT (hetero junction field effect transistor), a light source of an illumination or a display apparatus, and the like. In particular, a light emitting device using a III group nitride semiconductor has a direct transition-type bandgap corresponding to the range of visible rays to ultraviolet rays, and can perform high efficient light emission.

The nitride semiconductor has been mainly utilized as a LED or a LD (laser diode), and research for improving the manufacturing process or light efficiency had been conducted.

DISCLOSURE OF INVENTION

Technical Problem

Embodiments provide a semiconductor light emitting device capable of spatially insulating each layer with a light emitting structure and a method of fabricating the same.

Embodiments provide a semiconductor light emitting device comprising an cuter protection layer at the outer circumference between a light emitting structure and a conductive support substrate and also removing the cuter circumference of the light emitting structure, and a method of fabricating the same.

Technical Solution

An embodiment provides a semiconductor light emitting device comprising: a light emitting structure comprising a first conductive type semiconductor layer, an active layer under the first conductive type semiconductor layer, and a second conductive type semiconductor layer under the active layer; a reflective electrode layer under the light emitting structure; and an cuter protection layer at an outer circumference of the reflective electrode layer.

An embodiment provides a semiconductor light emitting device comprising: a light emitting structure comprising a first conductive type semiconductor layer, an active layer under the first conductive type semiconductor layer, a second conductive type semiconductor layer under the active layer, and an outer groove at an outer circumference of each of the layers; and a reflective electrode layer under the light emitting structure.

An embodiment provides a method of fabricating a semiconductor light emitting device comprising: forming a light emitting structure on a wafer substrate, the light emitting structure comprising at least a stacked first conductive type semiconductor layer, active layer, and second conductive type semiconductor layer; forming an outer protection layer at an outer circumference on the second conductive type semiconductor layer; and forming a reflective electrode layer on the second conductive type semiconductor layer and the outer protection layer.

Advantageous Effects

According to the embodiments, in case the materiel such as the dielectric is not formed at the outer of the light emitting structure, stress caused by contacting of dielectric at the outer of the light emitting structure can be reduced.

According to the embodiments, in case the dielectric is not formed at the outer of the light emitting structure, fabricating process of the light emitting device can be improved.

According to the embodiments, reliability of the light emitting device can be improved.

BRIEF DESCRIPTION OF THE DRAWINGS

FIG. 1 is a cross-sectional view of a semiconductor light emitting device according to an embodiment.

FIGS. 2 to 11 are views of semiconductor light emitting device manufacturing processes according to an embodiment.

BEST MODE FOR CARRYING OUT THE INVENTION

Hereinafter, a semiconductor light emitting device and a method of fabricating the same according to embodiments will be described in detail with reference to the accompanying drawings. In the following description, when a layer (or film) is referred to as being on/under another layer, its description will be made with reference to the accompanying drawings. The thickness of each layer may be described as one example, and is not limited to the thicknesses of the accompanying drawings.

FIG. 1 is a cross-sectional view of a semiconductor light emitting device according to an embodiment.

Referring to FIG. 1, a semiconductor light emitting device 100 comprises a first conductive type semiconductor layer 102, an active layer 103, a second conductive type semiconductor layer 104, an outer protection layer 107, a reflective electrode layer 108, a conductive support substrate 110, and a first electrode 112.

The first conductive type semiconductor layer 102 may be realized with an n-type semiconductor layer, and the n-type semiconductor layer may be formed of at least one layer by using a III-V group compound semiconductor. The n-type semiconductor layer may be formed of one among GaN, InN, AlN, InGaN, AlGaN, InAlGaN, and AlInN, and is doped with n-type dopants. The n-type dopants comprise a IV group element such as Si, Ge, Sn, Se, and Te.

The active layer 103 is formed under the first conductive type semiconductor layer 102. The active layer 103 is formed with a single quantum well structure or a multi quantum well structure. The active layer 103 comprises a quantum well layer formed of InGaN and a quantum barrier layer formed of GaN alternately, for example. Here, an $In_xGa_{1-x}N$ quantum well layer is adjusted through $0 \leq x \leq 1$. A p-type/n-type cladding layer may be formed on/under the active layer 103.

The second conductive type semiconductor layer 104 is formed under the active layer 103. The second conductive type semiconductor layer 104 may be realized with at least one of p-type semiconductor layer, and is doped with p-type dopants. The p-type semiconductor layer may be formed of one of a compound semiconductor such as GaN, InN, AlN, InGaN, AlGaN, InAlGaN, and AlInN. The p-type dopants comprise a II group element such as Mg, Zn, Ca, Sr, and Ba.

A structure of the first conductive type semiconductor layer 102, the active layer 103, and the second conductive type semiconductor layer 104 may be defined as a light emitting structure 105.

A transparent layer (not shown) may be formed under the second conductive type semiconductor layer 104. The transparent electrode layer may be formed of one of materials such as ITO, ZnO, IrOx, RuOx, and NiO. In the semiconductor light emitting device 100, the first conductive type semiconductor 102 is realized with an n-type semiconductor layer and the second conductive type semiconductor layer 103 is realized with a p-type semiconductor layer, or vice versa. Also, a n-type semiconductor layer or a p-type semiconductor layer is formed under the second conductive type semiconductor layer 103. Accordingly, the semiconductor light emitting device 100 may be realized with one of an n-p junction structure, a p-n junction structure, an n-p-n junction structure, and a p-n-p junction structure.

Additionally, each layer of the semiconductor light emitting device 100 is a compound semiconductor using a III-V group element, and may be applied to a GaN series semiconductor, a GaAs series semiconductor, an InGaAlP series semiconductor, and an AlGaAs series semiconductor.

In addition, the reflective electrode layer 108 is formed under the second conductive type semiconductor layer 104, and the conductive support substrate 110 is formed under the reflective electrode layer 108. Here, the reflective electrode layer 108 serves as a p-type electrode, and the p-type electrode becomes an ohmic contact in order to stably supply current to the second conductive type semiconductor layer 104. Here, the reflective electrode layer 108 may be formed of a single layer or a multilayer having one among Ag, Ni, Al, Rh, Pd, Ir, Ru, Mg, Zn, Pt, Au, Hf, a combination thereof. The conductive support substrate 110 may be formed of copper or gold. Materials of the reflective electrode layer 108 and the conductive support substrate 110 may vary and are not limited to the above materials.

The first electrode 112 is formed on the first conductive type semiconductor layer 102. Because the conductive support substrate 110 and the reflective electrode layer 108 serve as a second electrode, a vertical type semiconductor light emitting device can be realized.

In addition, the outer protection layer 107 is formed on the outer of the reflective electrode layer 108. The outer protection layer 107 may be formed with a frame form between the outer of the reflective electrode layer 108 and the second conductive type semiconductor layer 104. Here, the reflective electrode layers 108 may be formed with the same area contacting the conductive support substrate 110 in order to obtain electrical efficiency.

The outer protection layer 107 may be formed of one among compound semiconductors such as GaN, InN, AlN, InGaN, AlGaN, InAlGaN, and AlInN, and also may be formed of a layer that is doped with the n-type dopants, the p-type dopants, or no dopant, that is, an undoped semiconductor layer (e.g., an undoped GaN layer). Additionally, the outer protection layer 107 may be formed of the same material as the second conductive type semiconductor layer 104 and may be comprised as a structure of the second conductive type semiconductor layer 104.

The outer protection layer 107 may be insulated from a metal material such as the conductive support substrate 110 or the reflective electrode layer 108, such that electrical reliability of the light emitting structure 105 can be improved. Moreover, because the outer protection layer 107 is formed of a III-V compound semiconductor, stress caused by contacting the second conductive type semiconductor layer 104 can be reduced.

The outers of the first conductive type semiconductor layer 102, the active layer 103, the second conductive type semiconductor layer 104 are etched in a frame form. That is, the light emitting structure 105 comprises an outer groove 106 where a circumference area of each of the layers 102, 103, and 104 is etched. The outer groove 106 serves as a damper by moving the outer wall of the light emitting structure 105 toward the inside.

Furthermore, since an additional dielectric may be not formed on the outer groove 106, limitations due to the insulating material can be resolved and an electrical short circuit does not occur at each of the layers 102, 103, and 104 of the light emitting structure 105 even when it is used for many hours. That is, it may not be necessary to prevent an interlayer short of the light emitting structure 105 by forming an additional dielectric (e.g., $SiO_2$, epoxy, etc.) at the outer of the light emitting structure 105.

If a dielectric (e.g., $SiO_2$, epoxy, etc.) is formed at the outer of the light emitting structure 105, the dielectric may be exposed to a heat for hours such that thermal expansion or stress occurs during aging. Therefore, shrink or crack may occur at the dielectric. Accordingly, it is impossible to normally function to protect the outer of the light emitting structure 105.

According to this embodiment, because the outer groove 106 is formed with an open structure without forming a dielectric at the outer of the light emitting structure 105, more improved effect can be achieved. That is, the outer protection layer 107 disposed under the outer of the light emitting structure 105 prevents the swelling of metal foreign substances at the reflective electrode layer 108 or the conductive support substrate 110, which is caused by aging or thermal expansion. Furthermore, because the outer wall of the light emitting structure 105 is disposed more inward than the outer groove 106, an interlayer short circuit of the light emitting structure 105 due to metal foreign substances can be prevented.

The outer protection layer 107 may be formed with a predetermined thickness T1 (for example 5000 to 500 um) and a width W1 (for example, 20 um to 600 μm). The thickness T1 or the width W1 of the outer protection layer 107 may vary according to a chip size, and thus is not limited thereto.

The depth of the outer groove 106 of the light emitting structure 105 is the depth D1 exposing the second conductive type semiconductor layer 104 or the depth D2 exposing the outer protection layer 107.

Moreover, the width W2 of the outer groove 106 of the light emitting structure 105 is formed with the minimized value (e.g., 10 μm to 500 μm) for electrical characteristics of the light emitting structure 105. Here, the width W2 satisfies W2<W1.

FIGS. 2 to 11 are views of semiconductor light emitting device manufacturing processes according to an embodiment.

Referring to FIGS. 2 and 3, a first conductive type semiconductor layer 102 is formed on a wafer substrate 101, an active layer 103 is formed on the first conductive type semiconductor layer 102, and a second conductive type semiconductor layer 104 is formed on the active layer 103.

Here, the nitride thin layer grows on the wafer substrate 101 by using an E-beam evaporator, physical vapor deposition (PVD), chemical vapor deposition (CVD), plasma laser deposition (PLD), a dual-type thermal evaporator, sputtering, or metal organic chemical vapor deposition (MOCVD), but is not limited thereto. Hereinafter, one example in which the MOCVD is used for growing the nitride thin layer is described for convenience of description.

The wafer substrate 101 may use at least one of sapphire ($Al_2O_3$), SiC, Si, GaAs, GaN, ZnO, Si, GaP, InP, and Ge, and may be formed of a substrate having conductive characteristics. At least one among a buffer layer and an undoped semiconductor layer (not shown) may be formed between the wafer substrate 101 and the first conductive type semiconductor layer 102.

Referring to FIG. 3, the first conductive type semiconductor layer 102 may be realized with an n-type semiconductor layer, and the n-type semiconductor layer may be formed of at least one layer by using a III-V group compound semiconductor. The n-type semiconductor layer may comprise one of GaN, InN, AlN, InGaN, AlGaN, InAlGaN, and AlInN and is doped with n-type dopants. The n-type dopants comprise a IV group element such as Si, Ge, Sn, Se, and Te.

The active layer 103 is formed on the first conductive type semiconductor layer 102. The active layer 103 is formed with a single quantum well structure or a multi quantum well structure. The active layer 103 comprises a quantum well layer of InGaN and a quantum barrier layer of GaN alternately. Here, the $In_xGa_{1-x}N$ well layer may be adjusted through $0 \leq x \leq 1$. A p-type/n-type cladding layer may be formed above/under the active layer 103.

A second conductive type semiconductor layer 104 is formed on the active layer 103. The second conductive type semiconductor layer 104 may be realized with a p-type semiconductor layer of at least one layer and is doped with p-type dopants. The p-type semiconductor layer may comprise one of compound semiconductors such as GaN, InN, AlN, InGaN, AlGaN, InAlGaN, and AlInN, and the p-type dopants comprise a II group element such as Mg, Zn, Ca, Sr, and Ba.

A structure of the first conductive type semiconductor layer 102, the active layer 103, and the second conductive type semiconductor layer 104 may be defined as a light emitting structure 105. Additionally, a transparent electrode layer (not shown) may be formed of one of materials such as ITO, ZnO, IrOx, RuOx, and NiO.

In the semiconductor light emitting device 105, the first conductive type semicondcutor 102 is realized with an n-type semiconductor layer and the second conductive type semiconductor layer 103 is realized with a p-type semiconductor layer, or vice versa. Moreover, a transparent electrode, an n-type semiconductor layer, or a p-type semiconductor layer may be formed on the second conductive type semiconductor layer 104. Accordingly, the semiconductor light emitting device 105 may be realized with one of an n-p junction structure, a p-n junction structure, an n-p-n junction structure, and a p-n-p junction structure.

Referring to FIGS. 3 and 4, an oxide layer pattern 109 is formed on the surface of the center area A1 of the second conductive type semiconductor layer 104. The oxide layer pattern may be formed of one among $SiO_2$, $SiO_x$, $SiN_x$, and $SiO_xN_y$.

An outer protection layer 107 is formed on the surface of an outer area A2 of the second conductive type semiconductor layer 104. The outer protection layer 107 may be formed of a single layer or a multilayer comprising one of compound semiconductors such as GaN, InN, AlN, InGaN, AlGaN, InAlGaN, and AlInN. The outer protection layer 107 also may be formed of a layer that is doped with the n-type dopants, the p-type dopants, or no dopant, that is, an undoped semiconductor layer (e.g., an undoped GaN layer). Moreover, if the outer protection layer 107 is doped with p-type dopants, it is formed of the same material as the second conductive type semiconductor layer 104.

If the outer protection layer 107 is an undoped GaN layer, a predetermined thickness T1 can be achieved by supplying $NH_3$ and TMGa or TEGa at a growth temperature of 800° C. to 1000° C.

In one chip, the width W1 of the outer protection layer 107 is 20 μm to 600 μm, and its thickness T1 is 5000 to 500 μm. The width W1 and the thickness T1 of the outer protection layer 107 may vary according to a chip size.

Once the cuter protection layer 107 is formed, the oxide layer pattern 109 formed on the center area A1 of the second conductive type semiconductor layer 104 is removed. That is, the oxide layer pattern 109 may be removed by wet etching or dry etching.

FIG. 5 is a plan view of the wafer substrate of FIG. 4.

Referring to FIG. 5, the second conductive type semiconductor layer 104 and the cuter protection layer 107 are formed on the wafer substrate 101. The outer protection layer 107 is formed on an entire area except for the center area A1 of the second conductive type semiconductor layer 104 of each chip 100A, and an cuter area of the second conductive type semiconductor layer 104 has a frame form at boundaries L1 and L2 of each chip 100A.

Referring to FIG. 6, a reflective electrode layer 108 is formed on the second conductive type semiconductor layer 104 and the cuter protection layer 107. Here, the reflective electrode layer 108 serves as a p-type electrode, and the p-type electrode becomes an ohmic contact in order to stably supply current to the second conductive type semiconductor layer 104. Here, the reflective electrode layer 108 may be formed of a single layer or a multilayer having one among Ag, Ni, Al, Rh, Pd, Ir, Ru, Mg, Zn, Pt, Au, Hf, a combination thereof. A conductive support substrate 110 may be formed of copper or gold. Materials of the reflective electrode layer 108 and the conductive support substrate 110 may vary and are not limited to the above materials.

Referring to FIGS. 7 and 8, the wafer substrate 101 disposed under the first conductive type semiconductor layer 102 is removed using a physical and/or chemical removing method. For example, the removing method of the wafer substrate 101 may be performed through laser lift off (LLO). That is, when a laser of a predetermined wavelength is projected on the wafer substrate 101, heat energy is concentrated on the boundary between the wafer substrate 101 and the first conductive type semiconductor layer 102, such that the wafer substrate 101 is separated.

Here, when a buffer layer or/and an undoped semiconductor layer (not shown) is formed between the wafer substrate 101 and the first conductive type semiconductor layer 102, a wet etchant is injected at a specific layer for removal. Thus, the wafer substrate 101 can be separated.

A polishing process may be performed through Inductively coupled Plasma/Reactive Ion Etching (ICP/RCE) on the bottom of the first conductive type semiconductor layer 102 where the wafer substrate 101 is removed.

Referring to FIG. 9, when the conductive support substrate 110 is disposed under the light emitting structure 105, the first conductive type semiconductor layer 102 is disposed on the uppermost layer.

An outer groove 106 is formed at an outer area of the light emitting structure 105. The outer groove 106 is formed from the outer area of the first conductive type semiconductor layer 102 to a predetermined depth of the second conductive type semiconductor layer 104 by using mesa etching process. Here, the mesa etching process may be performed a dry or wet etching method.

The outer groove 106 is etched with the depth D1 exposing the second conductive type semiconductor layer 104 or the depth D2 exposing the outer protection layer 107. Accordingly, the outer groove 106 is formed from the outer area of the first conductive type semiconductor layer 102 to a predetermined depth of the second conductive type semiconductor layer 104. Therefore, an electrical short circuit is prevented at each interlayer of the light emitting structure 105. The width W2 of the outer groove 106 is 10 µm to 500 µm, which is less than the width W1 of the outer protection layer 107. The width W2 of the outer groove 106 may vary according to the size of a chip.

FIG. 10 is a plan view of FIG. 9.

Referring to FIG. 10, the outer groove 106 is formed in a frame form at the outer area of each chip 100A. Because the outer groove 106 is formed with a predetermined depth D2 at the outer area and the boundary area of the chip, this may be used when each chip 100A is separated.

Referring to FIG. 11, a first electrode 112 is formed on the first conductive type semiconductor layer 102. Additionally, at least one of the first electrode 112 and a transparent electrode (not shown) may be formed on the first conductive type semiconductor layer 102.

In the description, it will be understood that when a layer (or film) is referred to as being on or under another layer, it can be directly or indirectly on or under the other layer.

Any reference in this specification to one embodiment, an embodiment, example embodiment, etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

According to the embodiments, in case the materiel such as the dielectric is not formed at the outer of the light emitting structure, stress caused by contacting of dielectric at the outer of the light emitting structure can be reduced.

According to the embodiments, in case the dielectric is not formed at the outer of the light emitting structure, fabricating process of the light emitting device can be improved.

According to the embodiments, reliability of the light emitting device can be improved.

The invention claimed is:

1. A light emitting device comprising:
    a first conductive semiconductor layer formed with a first electrode;
    an active layer formed on the first conductive semiconductor layer;
    a second conductive semiconductor layer formed on the active layer, a height of a center portion of the second conductive semiconductor layer is different from a height of an outer circumference portion of the second conductive semiconductor layer;
    a reflective electrode layer formed on the second conductive semiconductor layer; and
    a conductive support substrate formed on the reflective electrode layer.

2. The light emitting device of claim 1, wherein the height of the outer circumference portion of the second conductive semiconductor layer is higher than the height of the center portion of the second conductive semiconductor layer.

3. The light emitting device of claim 1, wherein the outer circumference portion of the second conductive semiconductor layer comprises a same semiconductor material or a different semiconductor material from a semiconductor material of the center portion of the second conductive semiconductor layer.

4. The light emitting device of claim 3, wherein a semiconductor layer of the outer circumference portion includes at least one of an n-type semiconductor layer, a p-type semiconductor layer, and an undoped semiconductor layer.

5. The light emitting device of claim 1, wherein the first conductive semiconductor layer is a p-type semiconductor layer and the second conductive semiconductor layer is an n-type semiconductor layer.

6. The light emitting device of claim 1, comprising an etching groove which is formed by etching an outer circumference of each of the layers from the first conductive semiconductor layer to a portion of the second conductive semiconductor layer.

7. A method of manufacturing a light emitting device, the method comprising:
    forming a first conductive semiconductor layer on a substrate;
    forming an active layer on the first conductive semiconductor layer;
    forming a second conductive semiconductor layer on the active layer;
    forming an outer protection semiconductor layer on an outer circumference portion of the second conductive semiconductor layer; and
    forming a reflective electrode layer on the second conductive semiconductor layer and the outer protection semiconductor layer,
    wherein forming the outer protection semiconductor layer comprises:
    forming an oxide layer pattern on a center portion area of the second conductive semiconductor layer;
    forming the outer protection semiconductor layer on a circumference portion area of the second conductive semiconductor layer where the oxide layer pattern is not formed; and
    removing the oxide layer pattern.

8. The method of claim 7, comprising:
    forming a conductive support substrate on the reflective electrode layer;
    removing the substrate from the first conductive semiconductor layer; and
    disposing the conductive support substrate on a base and then etching an outer circumference of each layer of the layers from the first conductive semiconductor layer to a portion of the second conductive semiconductor layer.

9. The method of claim 8, comprising:
forming a transparent electrode or a first electrode at the first conductive semiconductor layer from which the substrate has been removed.

10. The method of claim 7, wherein the first conductive semiconductor layer is an n-type semiconductor layer and the second conductive semiconductor layer is a p-type semiconductor layer.

11. The method of claim 7, wherein the outer protection semiconductor layer includes at least one of an n-type semiconductor layer, a p-type semiconductor layer, and an undoped semiconductor layer.

* * * * *